US008879247B2

(12) United States Patent
Archibald et al.

(10) Patent No.: US 8,879,247 B2
(45) Date of Patent: Nov. 4, 2014

(54) COMPUTER CHASSIS COOLING SIDECAR

(75) Inventors: Matthew R. Archibald, Morrisville, NC (US); Jerrod K. Buterbaugh, Wake Forest, NC (US)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 13/446,647

(22) Filed: Apr. 13, 2012

(65) Prior Publication Data
US 2013/0178144 A1 Jul. 11, 2013

Related U.S. Application Data

(63) Continuation of application No. 12/840,863, filed on Jul. 21, 2010, now Pat. No. 8,233,274.

(51) Int. Cl.
*H05K 7/20* (2006.01)
*G06F 1/20* (2006.01)
(52) U.S. Cl.
CPC ........ *H05K 7/20145* (2013.01); *H05K 7/20745* (2013.01); *G06F 1/20* (2013.01); *H05K 7/20736* (2013.01)
USPC .............. 361/679.46; 361/679.49; 361/679.5; 361/679.51; 361/690; 165/104.33; 165/122; 454/184
(58) Field of Classification Search
USPC ............ 361/679.46–679.5, 679.53, 690–699, 361/715–728, 752, 831; 165/104.33, 165/121–127, 185; 312/223.2, 223.3, 236; 62/259.2; 454/184
See application file for complete search history.

(56) References Cited

U.S. PATENT DOCUMENTS

| 3,065,686 | A | 11/1962 | Geocaris |
| 3,318,225 | A | 5/1967 | May |
| 4,158,875 | A | 6/1979 | Tajima et al. |
| 4,335,647 | A | 6/1982 | Timmons |
| 4,531,454 | A | 7/1985 | Spoormaker |
| 4,775,001 | A | 10/1988 | Ward et al. |
| 5,216,579 | A * | 6/1993 | Basara et al. ............ 361/679.46 |

(Continued)

FOREIGN PATENT DOCUMENTS

| CN | 101173817 A | 5/2008 |
| CN | 101437385 A | 5/2009 |
| CN | 100533343 C | 8/2009 |
| CN | 201319718 Y | 9/2009 |

OTHER PUBLICATIONS

Office Action, U.S. Appl. No. 12/840,863, Jan. 26, 2012.
Notice of Allowance, U.S. Appl. No. 12/840,863, Mar. 22, 2012.

(Continued)

*Primary Examiner* — Michail V Datskovskiy
(74) *Attorney, Agent, or Firm* — Edward J. Lenart; Katherine S. Brown; Biggers Kennedy Lenart Spraggins LLP

(57) ABSTRACT

A computer chassis cooling sidecar for cooling one or more computers in a chassis of computers in a data center, the sidecar including an air intake chamber and a chassis delivery chamber, the air intake chamber having a first opening at a bottom end for receiving air from beneath the data center through perforated tiles in the floor of the data center located on the side of the computer chassis, the air intake chamber having at the top end a directional vane shaped to direct airflow from the side of the chassis to a chassis delivery chamber; wherein the chassis delivery chamber resides in front or back of the chassis and has an opening to receive air from the air intake chamber and an opening to deliver the received air to the front or back of the computer chassis.

19 Claims, 5 Drawing Sheets

(56) References Cited

U.S. PATENT DOCUMENTS

| | | | |
|---|---|---|---|
| 5,345,779 A | 9/1994 | Feeney | |
| 5,467,609 A * | 11/1995 | Feeney | 62/259.2 |
| 5,769,702 A | 6/1998 | Hanson | |
| 5,995,368 A | 11/1999 | Lee et al. | |
| 6,183,359 B1 | 2/2001 | Klein et al. | |
| 6,193,601 B1 | 2/2001 | Torczynski | |
| 6,222,729 B1 | 4/2001 | Yoshikawa | |
| 6,318,113 B1 | 11/2001 | Levy et al. | |
| 6,328,776 B1 | 12/2001 | Shanks et al. | |
| 6,402,613 B1 | 6/2002 | Teagle | |
| 6,411,515 B1 | 6/2002 | Sakamoto et al. | |
| 6,491,578 B2 | 12/2002 | Yoshinori et al. | |
| 6,526,702 B2 | 3/2003 | Jones | |
| 6,557,357 B2 | 5/2003 | Spinazzola et al. | |
| 6,574,104 B2 | 6/2003 | Patel et al. | |
| 6,574,970 B2 | 6/2003 | Spinazzola et al. | |
| 6,616,524 B2 | 9/2003 | Storck, Jr. et al. | |
| 6,648,752 B2 | 11/2003 | Vernier et al. | |
| 6,672,955 B2 | 1/2004 | Charron | |
| 6,694,759 B1 | 2/2004 | Bash et al. | |
| 6,747,872 B1 | 6/2004 | Patel et al. | |
| 6,772,604 B2 | 8/2004 | Bash et al. | |
| 6,775,997 B2 | 8/2004 | Bash et al. | |
| 6,813,897 B1 | 11/2004 | Bash et al. | |
| 6,819,563 B1 | 11/2004 | Chu et al. | |
| 6,826,456 B1 | 11/2004 | Irving et al. | |
| 6,832,489 B2 | 12/2004 | Bash et al. | |
| 6,832,490 B2 | 12/2004 | Bash et al. | |
| 6,834,512 B2 | 12/2004 | Bash et al. | |
| 6,854,284 B2 | 2/2005 | Bash et al. | |
| 6,862,179 B2 | 3/2005 | Beitelmal et al. | |
| 6,868,683 B2 | 3/2005 | Bash et al. | |
| 6,882,531 B2 | 4/2005 | Modica | |
| 6,945,058 B2 | 9/2005 | Bash et al. | |
| 6,957,544 B2 | 10/2005 | Dobbs et al. | |
| 7,033,267 B2 * | 4/2006 | Rasmussen | 454/184 |
| 7,050,300 B2 | 5/2006 | Hein | |
| 7,074,123 B2 | 7/2006 | Bettridge et al. | |
| 7,170,745 B2 | 1/2007 | Bash et al. | |
| 7,214,131 B2 | 5/2007 | Malone | |
| 7,226,353 B2 * | 6/2007 | Bettridge et al. | 454/184 |
| 7,251,547 B2 | 7/2007 | Bash et al. | |
| 7,259,963 B2 | 8/2007 | Germagian et al. | |
| 7,266,964 B2 | 9/2007 | Vogel et al. | |
| 7,347,058 B2 | 3/2008 | Malone et al. | |
| 7,361,081 B2 | 4/2008 | Beitelmal et al. | |
| 7,366,632 B2 | 4/2008 | Hamann et al. | |
| 7,379,298 B2 * | 5/2008 | Walsh et al. | 361/692 |
| 7,486,511 B1 | 2/2009 | Griffel et al. | |
| 7,518,863 B2 | 4/2009 | Wayman et al. | |
| 7,568,360 B1 | 8/2009 | Bash et al. | |
| 7,596,476 B2 | 9/2009 | Rasmussen et al. | |
| 7,643,291 B2 | 1/2010 | Mallia et al. | |
| 7,644,051 B1 | 1/2010 | Moore et al. | |
| 7,656,660 B2 | 2/2010 | Hoeft et al. | |
| 7,660,109 B2 | 2/2010 | Iyengar et al. | |
| 7,660,116 B2 | 2/2010 | Claassen et al. | |
| 7,726,144 B2 | 6/2010 | Larson et al. | |
| 7,739,073 B2 | 6/2010 | Hamann et al. | |
| 7,756,667 B2 | 7/2010 | Hamann et al. | |
| 7,862,410 B2 | 1/2011 | McMahan et al. | |
| 7,864,527 B1 | 1/2011 | Whitted | |
| 7,864,530 B1 | 1/2011 | Hamburgen et al. | |
| 7,869,210 B2 | 1/2011 | Moss | |
| 7,878,889 B2 | 2/2011 | Day | |
| 7,881,910 B2 | 2/2011 | Rasmussen et al. | |
| 7,885,795 B2 | 2/2011 | Rasmussen et al. | |
| 7,903,407 B2 | 3/2011 | Matsushima et al. | |
| 7,907,402 B2 | 3/2011 | Caveney | |
| 7,957,139 B2 | 6/2011 | Davis et al. | |
| 7,979,250 B2 | 7/2011 | Archibald et al. | |
| 7,986,526 B1 | 7/2011 | Howard et al. | |
| 7,991,592 B2 | 8/2011 | VanGilder et al. | |
| 8,009,430 B2 | 8/2011 | Claassen et al. | |
| 8,054,625 B2 | 11/2011 | Noteboom et al. | |
| 8,083,302 B2 | 12/2011 | Thompson et al. | |
| 8,090,476 B2 | 1/2012 | Dawson et al. | |
| 8,144,464 B2 | 3/2012 | VanDerVeen et al. | |
| 8,160,838 B2 | 4/2012 | Ramin et al. | |
| 8,164,897 B2 * | 4/2012 | Graybill et al. | 361/679.49 |
| 8,175,753 B2 | 5/2012 | Sawczak et al. | |
| 8,229,713 B2 | 7/2012 | Hamann et al. | |
| 8,244,502 B2 | 8/2012 | Hamann et al. | |
| 8,250,877 B2 | 8/2012 | Correa et al. | |
| 8,346,398 B2 | 1/2013 | Ahmed et al. | |
| 8,473,265 B2 | 6/2013 | Hlasny et al. | |
| 8,514,577 B2 | 8/2013 | Chen | |
| 8,553,411 B2 | 10/2013 | Abraham et al. | |
| 8,560,677 B2 | 10/2013 | VanGilder et al. | |
| 8,582,292 B1 | 11/2013 | Eichelberg | |
| 8,639,482 B2 | 1/2014 | Rasmussen et al. | |
| 8,672,732 B2 | 3/2014 | Rasmussen et al. | |
| 2003/0067745 A1 | 4/2003 | Patel et al. | |
| 2005/0159099 A1 | 7/2005 | Malone | |
| 2005/0192680 A1 | 9/2005 | Cascia et al. | |
| 2005/0237716 A1 | 10/2005 | Chu et al. | |
| 2005/0267639 A1 | 12/2005 | Sharma et al. | |
| 2006/0074609 A1 | 4/2006 | Freeman et al. | |
| 2006/0199508 A1 | 9/2006 | Nair et al. | |
| 2006/0260338 A1 | 11/2006 | VanGilder et al. | |
| 2007/0167125 A1 | 7/2007 | Rasmussen et al. | |
| 2007/0171610 A1 | 7/2007 | Lewis | |
| 2007/0173189 A1 | 7/2007 | Lewis | |
| 2008/0204999 A1 | 8/2008 | Clidaras et al. | |
| 2008/0269932 A1 | 10/2008 | Chardon et al. | |
| 2008/0285232 A1 | 11/2008 | Claassen et al. | |
| 2008/0288193 A1 | 11/2008 | Claassen et al. | |
| 2009/0012633 A1 | 1/2009 | Liu et al. | |
| 2009/0031896 A1 | 2/2009 | Abraham et al. | |
| 2009/0059523 A1 | 3/2009 | Mallia et al. | |
| 2009/0061755 A1 | 3/2009 | Calder et al. | |
| 2009/0107652 A1 | 4/2009 | VanGilder et al. | |
| 2009/0113323 A1 | 4/2009 | Zhao et al. | |
| 2009/0138313 A1 | 5/2009 | Morgan et al. | |
| 2009/0150123 A1 | 6/2009 | Archibald et al. | |
| 2009/0156114 A1 | 6/2009 | Ahladas et al. | |
| 2009/0168345 A1 | 7/2009 | Martini | |
| 2009/0173017 A1 | 7/2009 | Hall | |
| 2009/0259343 A1 | 10/2009 | Rasmussen et al. | |
| 2009/0277605 A1 | 11/2009 | Vangilder et al. | |
| 2009/0305625 A1 | 12/2009 | Dawson et al. | |
| 2009/0326879 A1 | 12/2009 | Hamann et al. | |
| 2009/0326884 A1 | 12/2009 | Amemiya et al. | |
| 2010/0027216 A1 | 2/2010 | Matsushima et al. | |
| 2010/0030528 A1 | 2/2010 | Smith et al. | |
| 2010/0035535 A1 | 2/2010 | Taylor | |
| 2010/0041327 A1 | 2/2010 | Desler | |
| 2010/0064610 A1 | 3/2010 | Kulkarni et al. | |
| 2010/0067745 A1 | 3/2010 | Kovtun et al. | |
| 2010/0126696 A1 | 5/2010 | Novotny et al. | |
| 2010/0151781 A1 | 6/2010 | Slessman et al. | |
| 2010/0263830 A1 | 10/2010 | Noteboom et al. | |
| 2011/0189936 A1 | 8/2011 | Haspers et al. | |
| 2011/0205705 A1 * | 8/2011 | Graybill et al. | 361/696 |
| 2011/0246147 A1 | 10/2011 | Rasmussen et al. | |
| 2011/0288664 A1 | 11/2011 | Archibald et al. | |
| 2012/0020009 A1 | 1/2012 | Archibald et al. | |
| 2012/0033368 A1 | 2/2012 | Archibald et al. | |
| 2012/0035781 A1 | 2/2012 | Archibald et al. | |
| 2012/0054527 A1 | 3/2012 | Pfeifer et al. | |
| 2012/0071992 A1 | 3/2012 | VanGilder et al. | |
| 2012/0072195 A1 | 3/2012 | Archibald et al. | |
| 2012/0109404 A1 | 5/2012 | Pandey et al. | |
| 2012/0243173 A1 | 9/2012 | Archibald et al. | |
| 2013/0166258 A1 | 6/2013 | Hamann et al. | |
| 2013/0178144 A1 | 7/2013 | Archibald et al. | |
| 2013/0200764 A1 | 8/2013 | Archibald et al. | |

OTHER PUBLICATIONS

IBM, "Automatic Opening Floor Tile for Back-up Air Cooling of Server Racks", IP.Com Prior Art Database, Jul. 18, 2005, pp. 1-5, IP.com No. IPCOM000126445D, IP.com.

(56) References Cited

OTHER PUBLICATIONS

IBM, "Dynamic Thermal Mapping and Trend Analysis As a Control Mechanism for HVAC Systems in Data Centers," IP.Com Prior Art Database, Mar. 27, 2006, pp. 1-3, IP.com No. IPCOM000135036D, IP.com.

Disclosed Anonymously, "Method for a Managed Airflow Server Cabinet", IP.Com Prior Art Database, Apr. 26, 2006, pp. 1-7, IP.com No. IPCOM000135845D, IP.com.

IBM, "Apparatus and Method for Measuring Volumetric Airflow Rates for a BlueGene Rack or Rack Assembly with Vertical Airflow", IP.Com Prior Art Database, Jun. 18, 2008, pp. 1-9, IP.com No. IPCOM000171776D, IP.com.

IBM, "The Cooling Control System of Server", IP.Com Prior Art Database, Dec. 29, 2009, pp. 1-4, IP.com No. IPCOM000191308D, IP.com.

El-Hakim, S.F., et al., "Sensor Based Creation of Indoor Virtual Environment Models", Proceedings of the 1997 International Conference on Virtual Systems and MultiMedia, VSMM '97, Sep. 10-12, 1997, pp. 50-58, IEEE Computer Society, Washington, DC, USA. DOI: 10.1109/VSMM.1997.622327.

Office Action, U.S. Appl. No. 12/851,992, Feb. 21, 2012.
Notice of Allowance, U.S. Appl. No. 12/851,992, May 9, 2012.
Office Action, U.S. Appl. No. 12/781,915, Apr. 26, 2013.
Final Office Action U.S. Appl. No. 12/781,915, Oct. 24, 2013.
Final Office Action U.S. Appl. No. 12/852,091, Apr. 23, 2013.
Notice of Allowance U.S. Appl. No. 12/852,091, Aug. 21, 2013.
Office Action U.S. Appl. No. 12/852,091, Nov. 26, 2012.
Final Office Action U.S. Appl. No. 12/885,456, Sep. 10, 2013.
Office Action U.S. Appl. No. 12/885,456, Mar. 19, 2013.
Kim et al., "Indoor Spatial Analysis Using Space Syntax", The International Archives of the Photogrammetry, Remote Sensing and Spatial Information Sciences, vol. XXXVII, Part B2, Jul. 2008, pp. 1065-1070, International Society for Photogrammetry and Remote Sensing (ISPRS), The Netherlands.
Papakonstantinou et al., "Air quality in an underground garage: computational and experimental investigation of ventilation effectiveness", Energy and Buildings, vol. 35, Issue 9, Oct. 2003, pp. 933-940, ScienceDirect.com (online publication), Elsevier B.V., Amsterdam.
Notice of Allowance, U.S. Appl. No. 12/885,456, Apr. 7, 2014, pp. 1-15.
Office Action, U.S. Appl. No. 13/479,708, Apr. 10, 2014, pp. 1-12.

\* cited by examiner

COMPUTER CHASSIS COOLING SIDECAR

CROSS-REFERENCE TO RELATED APPLICATION

This application is a continuation application of and claims priority from U.S. patent application Ser. No. 12/840,863, filed on Jul. 21, 2010 now U.S. Pat. No. 8,233,274.

BACKGROUND OF THE INVENTION

1. Field of the Invention

The field of the invention is cooling one or more computers in a chassis of computers in a data center.

2. Description of Related Art

Typical data centers have floor tiles that are perforated. Cooled air is blown up from air conditioner beneath the data center through the perforated tiles in the floor to cool the computers. The chassis containing computers in the data center often have fans to blow cooled air from the front of the chassis to the back of the chassis to cool the computers. Furthermore, in conventional data centers, the chassis containing the computers are often aligned in rows. As such, the air blown up through the perforated tiles between the rows is located on the sides of the chassis is not utilized in an efficient manner to cool the computers.

SUMMARY OF THE INVENTION

A computer chassis cooling sidecar for cooling one or more computers in a chassis of computers in a data center, the sidecar including an air intake chamber and a chassis delivery chamber, the air intake chamber having a first opening at a bottom end for receiving air from beneath the data center through perforated tiles in the floor of the data center located on the side of the computer chassis, the air intake chamber having at the top end a directional vane shaped to direct airflow from the side of the chassis to a chassis delivery chamber residing in front or back of the chassis and having an opening to receive air from the air intake chamber and an opening to deliver the received air to the front or back of the computer chassis.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
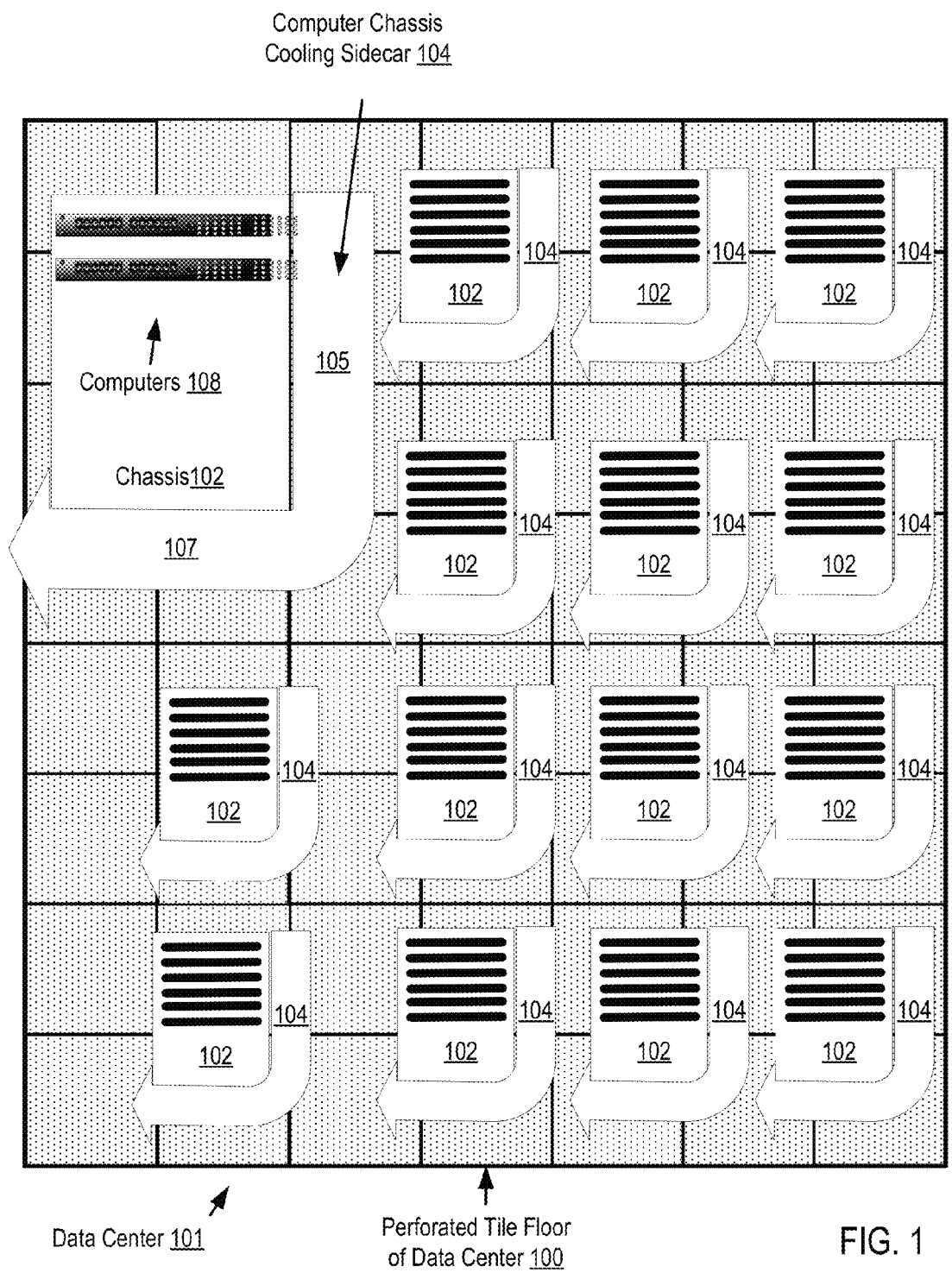
FIG. 1 sets forth a block diagram of an aerial view of a data center including a system for cooling one or more computers in a chassis of computers in a data center according to embodiments of the present invention.

Exemplary systems, computer chassis sidecar, and methods for cooling one or more computers in a chassis of computers in a data center in accordance with the present invention are described with reference to the accompanying drawings, beginning with FIG. 1. FIG. 1 sets forth a block diagram of an aerial view of a data center including a system for cooling one or more computers in a chassis of computers in a data center according to embodiments of the present invention. A data center is a facility used to house computer systems and associated components, such as telecommunications and storage systems. Data centers typically also include redundant or backup power supplies, redundant data communications connections, and environmental controls such as air conditioning, fire suppression, and security devices.

The data center (101) of FIG. 1 includes a number of chassis (102) of computers (108). Chassis of computers whose individual computers may be cooled according to embodiments of the present invention may include for example blade environments including chassis of blade servers, server racks and others as will occur to those of skill in the art.

The data center (101) of FIG. 1 also has a perforated tile floor (100) beneath which is installed an air conditioning system. Cooled air is blown from beneath the perforated tile floor to cool the racks (102) of computers (108) of the data center.

Each of the computer chassis (102) of FIG. 1 is cooled using a computer chassis cooling sidecar (104) according to embodiments of the present invention. Each computer chassis cooling sidecar includes an air intake chamber (105) residing on the side of the computer chassis and a chassis delivery chamber (107) residing to the front of the chassis. The air intake chambers have a first opening for receiving cooled air from the source of cooled air (100), the air conditioning units (199 in FIG. 4) beneath the perforated tile floor. The air intake chambers of the computer chassis side cars (104) of FIG. 1 have at the top end a directional vane shaped to direct airflow from the side of the chassis (102) to a chassis delivery chamber (107) that resides in front of the chassis (102) and has an opening to receive air from the air intake chamber (105) and an opening to deliver the received air to the front of the computer chassis (105).

In the example of FIG. 1, the air intake chambers (105) and the chassis delivery chambers (107) are connected to make L-shaped chambers. Such L-shaped chambers may be designed to conform to the size of the chassis that they are cooling and may designed to conform to the way the chassis are organized in the data center. Also in the example of FIG. 1, each computer chassis cooling sidecar (104) is attached to the exterior of each computer chassis (107). In alternative embodiments, the computer chassis cooling sidecar may be integrated within the interior of a computer chassis.

Computer chassis cooling sidecars according to embodiments of the present invention may also include hinged doors, sliding doors, windows, or any other closable access to the chassis of computer chassis such that a systems administrator may access the computers within the chassis without moving the side car. To increase airflow to the computer chassis, the perforated floor tiles below the computer chassis cooling sidecar may be removed.

In the example of FIG. 1, the chassis delivery chamber (107) resides in the front of the chassis. In alternative embodiments, such a chassis delivery chamber may reside in the back of the chassis. In still further embodiments, a chassis delivery chamber may reside both in front and in back of the chassis.

The arrangement of servers and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
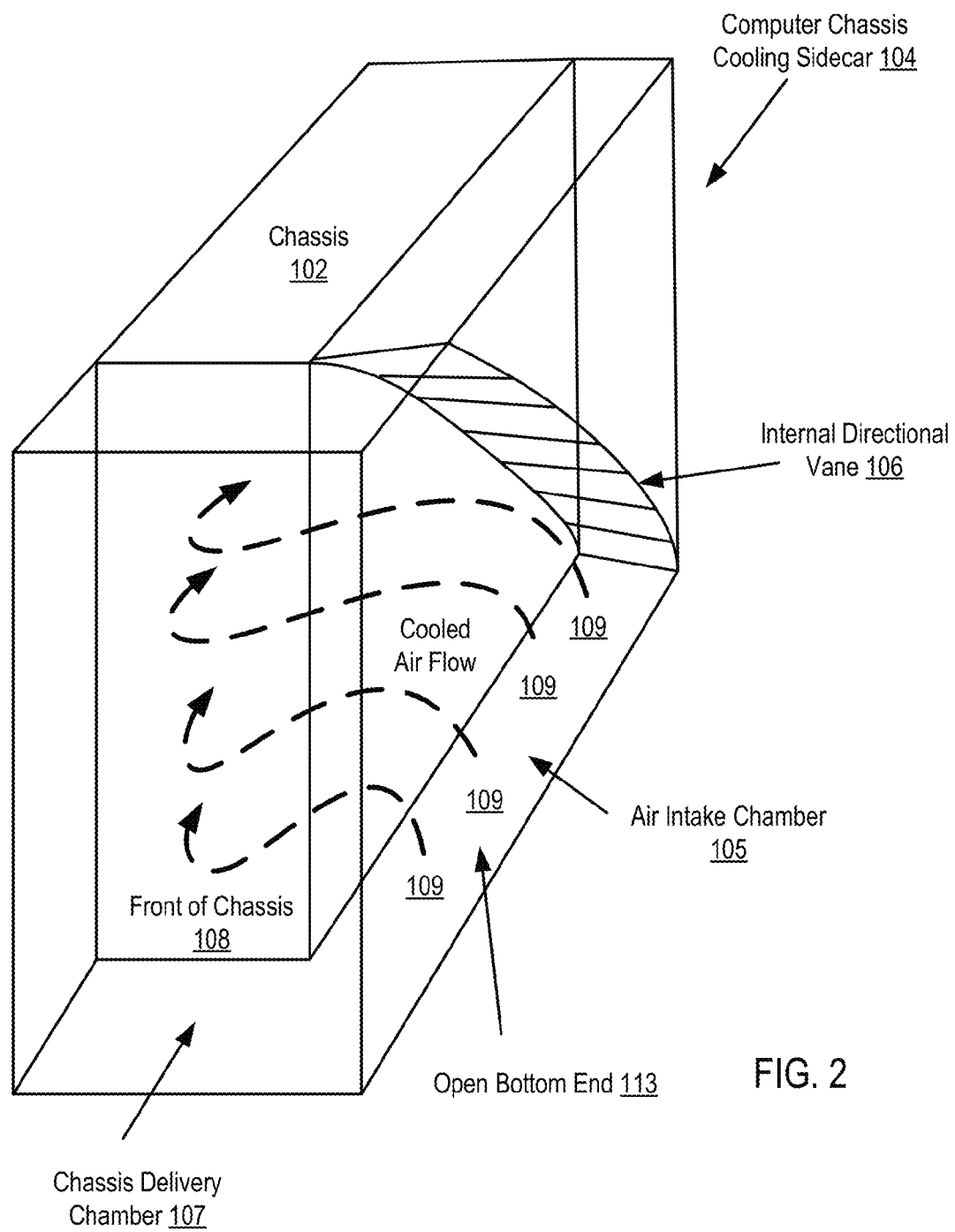
FIG. 2 sets forth a line drawing of a computer chassis cooling sidecar for cooling one or more computers in a chassis of computers in a data center according to embodiments of the present invention.

For further explanation, FIG. 2 sets forth a line drawing of a computer chassis cooling sidecar (104) for cooling one or more computers in a chassis of computers in a data center according to embodiments of the present invention. The computer chassis cooling the sidecar (104) of FIG. 2 includes an air intake chamber (105) and a chassis delivery chamber (107). The air intake chamber (105) of FIG. 2 has a first opening at a bottom end (113) for receiving air from beneath the data center through perforated tiles in the floor of the data center located on the side of the computer chassis. The air intake chamber (105) of FIG. 2 is enclosed at least on the exterior side and top such that cooled air is contained and directed to the chassis delivery chamber.

The air intake chamber (105) of FIG. 2 also has at the top end a directional vane (106) shaped to direct airflow (109) from the side of the chassis to a chassis delivery chamber (107). The chassis delivery chamber (107) of FIG. 2 resides in front of the chassis (102) and has an opening to receive air from the air intake chamber (105) and an opening to deliver the received air (109) to the front (108) of the computer chassis (102). Cool air then blows across the computers in the chassis (102). The chassis delivery chamber of FIG. 2 is also enclosed at least on the exterior sides such that cooled air is contained and directed to the chassis.

In the example of FIG. 2, the air intake chamber (105) is completely open to the chassis delivery chamber (107). This is for explanation and not for limitation. In alternative embodiments the size and shape of the opening between the air intake chamber and the chassis delivery chamber and the size and shape of the directional vane may vary according to many design factors such as air flow patterns, quantity of cooled air received in the air intake chamber, temperature of the air received in the air intake chamber, size of the sidecar, and many others as will occur to those of skill in the art.

In the computer chassis cooling sidecar (104) of FIG. 2, the chassis delivery chamber (107) also has an opening at a bottom end for receiving air from beneath the data center in front of the computer chassis. In such embodiments, additional cooled air is received from the front of the chassis and blown across the computers of the chassis.

In the computer chassis cooling sidecar (104) of FIG. 2, the air intake chamber (105) and the chassis delivery chamber (107) are connected to make an L-shaped chamber. This is for explanation, and not for limitation. Computer chassis cooling sidecars according to embodiments of the present invention may take on many shapes and sizes according to design considerations such as air flow patterns, quantity of cooled air received in the air intake chamber, temperature of the air received in the air intake chamber, size of the sidecar, and many others as will occur to those of skill in the art.

In some embodiments of the computer chassis cooling sidecar (104) of FIG. 2 the computer chassis cooling sidecar is attached to the exterior of a computer chassis (102). In alternative embodiments, the computer chassis cooling sidecar (104) is integrated within the interior of a computer chassis.

Computer chassis cooling sidecars of the present invention may be made of plastic, metal or any other material that will occur to those of skill in the art. Often such sidecars may be made of lightweight material such that they may be moved to various computers in the data center.

Computer chassis cooling sidecars according to embodiments of the present invention may also include hinged doors, sliding doors, windows, or any other closable access to the chassis of computer chassis such that a systems administrator may access the computers within the chassis without moving the side car. To increase airflow to the computer chassis, the perforated floor tiles below the computer chassis cooling sidecar may be removed.

In the example of FIG. 1, the chassis delivery chamber (107) resides in the front of the chassis. In alternative embodiments, such a chassis delivery chamber may reside in the back of the chassis. In still further embodiments, a chassis delivery chamber may reside both in front and in back of the chassis.

Figure 3:
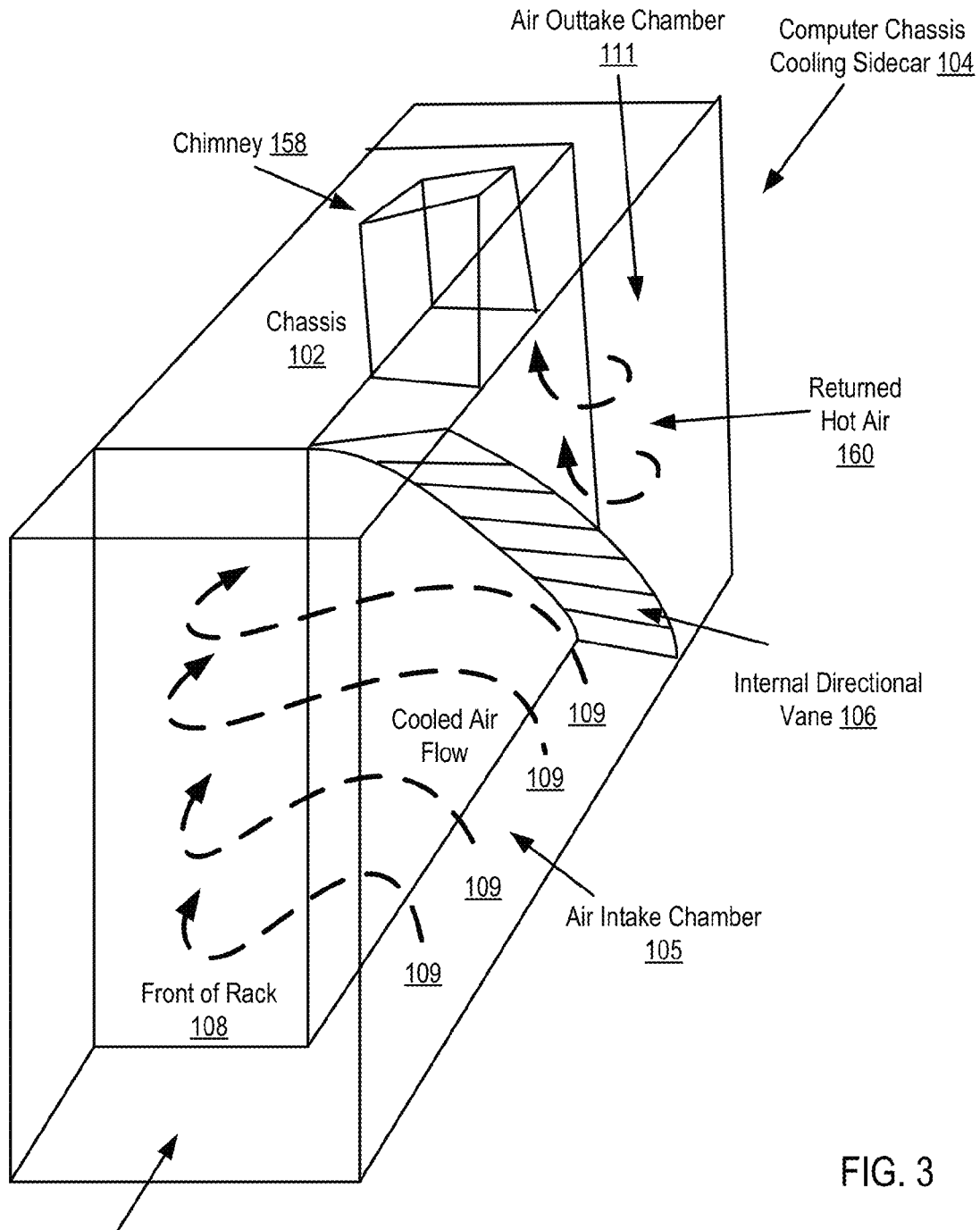
FIG. 3 sets forth a line drawing of another computer chassis cooling sidecar for cooling one or more computers in a chassis of computers in a data center according to embodiments of the present invention.

For further explanation, FIG. 3 sets forth a line drawing of another computer chassis cooling sidecar (104) for cooling one or more computers in a chassis of computers in a data center according to embodiments of the present invention. The computer chassis cooling sidecar (104) of FIG. 3 is similar to the computer chassis cooling sidecar of FIG. 2 in that it includes an air intake chamber (105) and a chassis delivery chamber (107). The air intake chamber (105) of FIG. 3 has a first opening at a bottom end (113) for receiving air from beneath the data center through perforated tiles in the floor of the data center located on the side of the computer chassis. The air intake chamber (105) of FIG. 3 also has at the top end a directional vane (106) shaped to direct airflow (109) from the side of the chassis to a chassis delivery chamber (107). The chassis delivery chamber (107) of FIG. 3 also resides in front of the chassis (102) and has an opening to receive air from the air intake chamber (105) and an opening to deliver the received air (109) to the front (108) of the computer chassis (102). Fans in the chassis may then blow cooled air across the computers in the chassis (102).

The computer chassis cooling sidecar (104) of FIG. 3 differs from the computer chassis cooling sidecar (104) of FIG. 2 in that the computer chassis cooling sidecar (104) also includes an air outtake chamber (111) that is thermally separated from the air intake chamber (105) by the directional vane (106). The side of the directional vane (106) in the example of FIG. 3 exposed to the air outtake chamber (111) is shaped to direct airflow (160) from the air outtake chamber (111) to a chimney (158). After the cooled air is blown across the computers of the chassis, the returned hot air (160) is directed out the chimney (158) and to the top of the data center where it may be recycled to the air conditioners below the floor of the data center.

As discussed above with reference to the example of FIG. 2, the size, shape and materials used in computer chassis cooling sidecars according to embodiments of the present invention may vary according to many design factors that will occur to those of skill in the art.

Computer chassis cooling sidecars according to embodiments of the present invention may also include hinged doors, sliding doors, windows, or any other closable access to the chassis of computer chassis such that a systems administrator may access the computers within the chassis without moving the side car. To increase airflow to the computer chassis, the perforated floor tiles below the computer chassis cooling sidecar may be removed.

In the example of FIG. 1, the chassis delivery chamber (107) resides in the front of the chassis. In alternative embodiments, such a chassis delivery chamber may reside in the back of the chassis.

Figure 4:
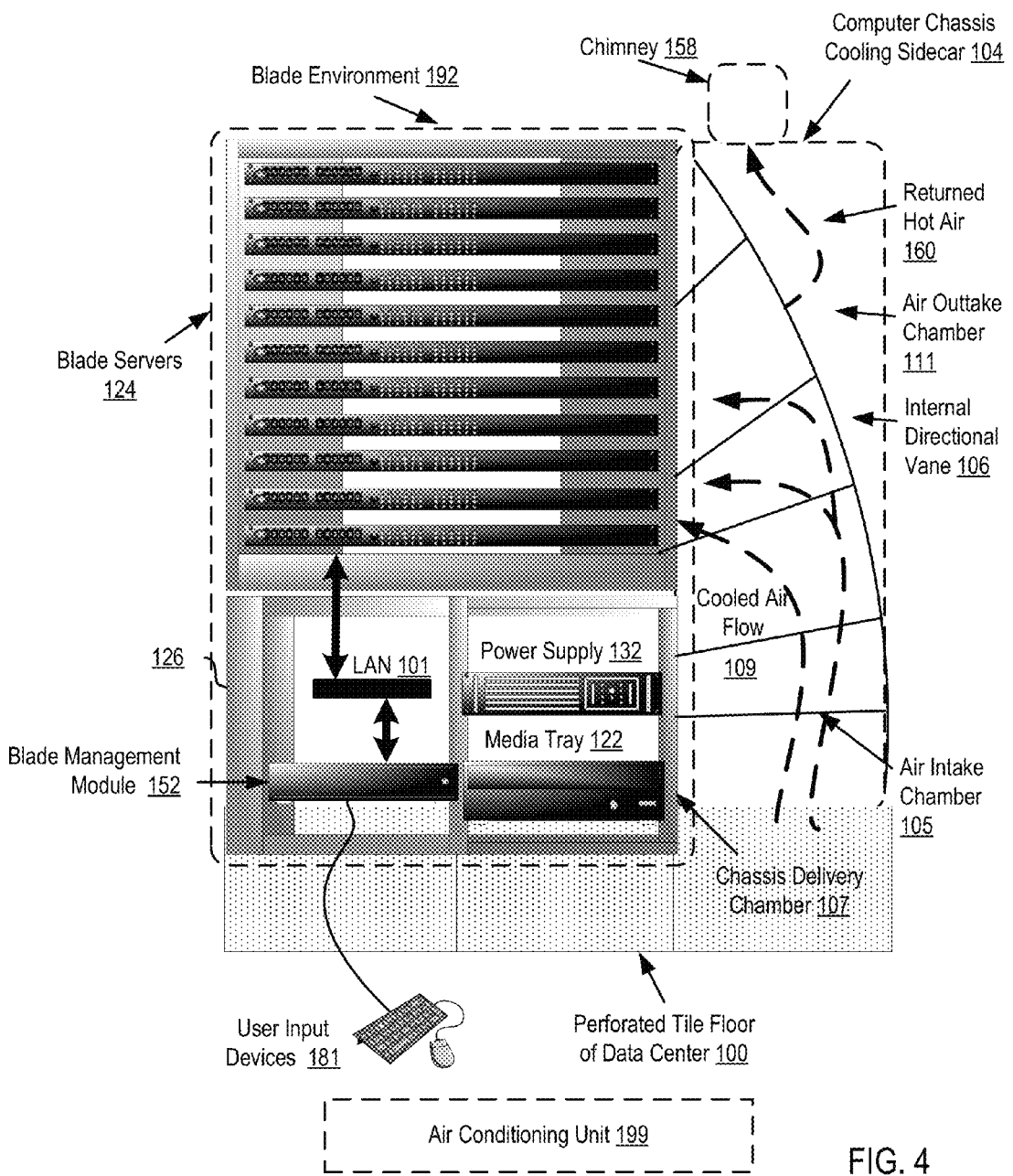
FIG. 4 sets forth a diagram of a system for cooling one or more computers in a chassis of computers in a data center according to embodiments of the present invention.

For further explanation, FIG. 4 sets forth a diagram of a front view of a system for cooling one or more computers in a chassis of computers in a data center according to embodiments of the present invention. The example of FIG. 4 includes a blade environment (192). 'Blade environment,' as the term is used in this specification, refers generally to a blade server system installed in this example in a two-bay chassis (126) and including a number of blade servers (124), one or more blade management modules (152), a media tray (122), and a blade server system power supply (132).

The blade management module (152) is a small computer in its own right, including software and hardware components, one or more computer processors and computer memory, that provides system management functions for all components in the example blade environment (192) including the blade servers (124) and the media tray (122). The blade management module of FIG. 4 also makes available connections for user input devices such as mice or keyboards (181) that are not generally connected directly to the blade servers or to the blade environment chassis. The blade servers themselves (124), installed in a cabinet bay (126) of the exemplary blade environment (192) in the example of FIG. 4, are several computing devices implemented in blade form factor. The blade servers share access to the media tray (122). The blade servers (124) are connected to one another and to the blade management module (152) for data communications through a local area network ('LAN') (101). The LAN (101) is a small network installed within the chassis of the blade environment.

The media tray (122) houses non-volatile memory media generally. A media tray may typically include Compact Disc read-only media drives (CD-ROM), Digital Video Disc ROM drives (DVD-ROM), CD-RW drives, DVD-RW drives, floppy disk drives, and so on as will occur those of skill in the art.

The system of FIG. 4 includes a chassis cooling sidecar (104) for cooling one or more computers in a chassis of the blade environment. The sidecar (104) of FIG. 1 includes an air intake chamber (105) and a chassis delivery chamber in front of the chassis (107). The air intake chamber (105) has a first opening at a bottom end for receiving air from beneath the data center through perforated tiles (100) in the floor of the data center located on the side of the computer chassis. The air intake chamber (105) having at the top end a directional vane (106) shaped to direct airflow (109) from the side of the chassis to a chassis delivery chamber (107) that resides in front of the chassis (126) and has an opening to receive air from the air intake chamber (105) and an opening to deliver the received air (109) to the front of the computer chassis (102).

The computer chassis cooling sidecar of FIG. 4 also includes an air outtake chamber (111) thermally separated from the air intake chamber (105) by the directional vane (106) and wherein a side of the directional vane (106) exposed to the air outtake chamber (111) is shaped to direct airflow (160) from the air outtake chamber (111) to a chimney (158) and out of the sidecar (104). In the computer chassis cooling sidecar (104) of FIG. 4 the chimney is located at a top of the computer chassis cooling side car. This is for explanation and not for limitation. In fact, chimneys for exiting returned hot air may be located in other places on the sidecar such as on the side or back of the sidecar.

Computer chassis cooling sidecars according to embodiments of the present invention may also include hinged doors, sliding doors, windows, or any other closable access to the chassis of computer chassis such that a systems administrator may access the computers within the chassis without moving the side car. To increase airflow to the computer chassis, the perforated floor tiles below the computer chassis cooling sidecar may be removed.

In the example of FIG. 1, the chassis delivery chamber (107) resides in the front of the chassis. In alternative embodiments, such a chassis delivery chamber may reside in the back of the chassis. In still further embodiments, a chassis delivery chamber may reside both in front and in back of the chassis.

The arrangement of the blade environment (192), network (101), and other devices making up the exemplary system illustrated in FIG. 4 are for explanation, not for limitation. Data processing systems useful according to various embodiments of the present invention may include additional servers, routers, and other devices, not shown in FIG. 4, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 4.

Figure 5:
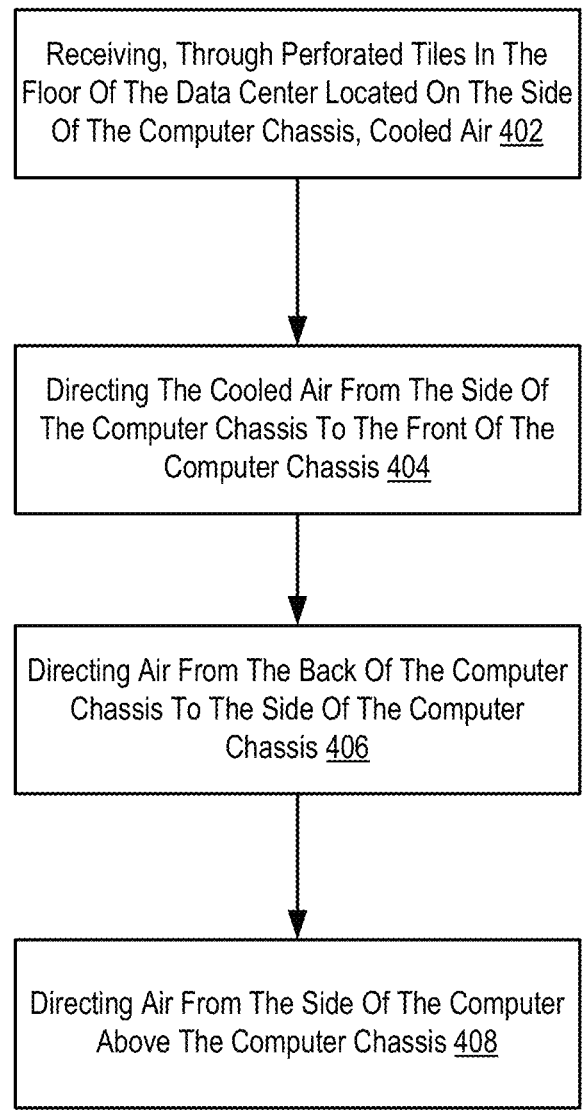
FIG. 5 sets forth a flow chart illustrating an exemplary method for cooling one or more computers in a chassis of computers in a data center according to embodiments of the present invention.

For further explanation, FIG. 5 sets forth a flow chart illustrating an exemplary method for cooling one or more computers in a chassis of computers in a data center according to embodiments of the present invention. The method of FIG. 5 includes receiving (402), through perforated tiles in the floor of the data center located on the side of the computer chassis, cooled air. Receiving (402), through perforated tiles in the floor of the data center located on the side of the computer chassis, cooled air may be carried out by an air intake chamber designed to collect air from the side of the chassis. In some embodiments, such an air intake chamber may reside in a sidecar according to embodiments of the present invention.

The method of FIG. 5 also includes directing (404) the cooled air from the side of the computer chassis to the front of the computer chassis. Directing (404) the cooled air from the side of the computer chassis to the front of the computer chassis may be carried out by a direction vane shaped to direct air to the front of a computer chassis according to embodiments of the present invention. In some embodiments, such a directional vane may reside within a sidecar according to embodiments of the present invention. In alternative embodiments the directional vane may be implemented as the top or top and sides of a chamber shaped to wrap from the side of a chassis to the front of a chassis.

The method of FIG. 5 also includes directing (406) air from the back of the computer chassis to the side of the computer chassis. Directing (406) air from the back of the computer chassis to the side of the computer chassis may be implemented with an insulated directional vane in an air outtake chamber of a computer chassis side car according to embodiments of the present invention.

The method of FIG. 5 also includes directing (408) air from the side of the computer above the computer chassis. Directing (408) air from the side of the computer above the computer chassis may be carried out through a chimney of an air outtake chamber of a computer chassis side car according to embodiments of the present invention.

Exemplary embodiments of the present invention are described largely in the context of a fully functional system, sidecar and method for cooling one or more computers in a chassis of computers in a data center. Readers of skill in the art will recognize, however, that some aspects of the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A computer chassis cooling sidecar for cooling one or more computers in a chassis of computers in a data center, the sidecar comprising:
   an air intake chamber and a chassis delivery chamber, the air intake chamber having a first opening at a bottom end for receiving air from beneath the data center through perforated tiles in the floor of the data center located on the side of the computer chassis, the air intake chamber having at the top end a directional vane shaped to direct airflow from the side of the chassis to a chassis delivery chamber;
   wherein the chassis delivery chamber resides in front or back of the chassis and has an opening to receive air from the air intake chamber and an opening to deliver the received air to the front or back of the computer chassis.

2. The computer chassis cooling sidecar of claim 1 wherein the directional vane is insulated and the computer chassis cooling sidecar includes an air outtake chamber thermally separated from the air intake chamber by the insulated directional vane and wherein a side of the directional vane exposed to the air outtake chamber is shaped to direct airflow from the air outtake chamber to a chimney.

3. The computer chassis cooling sidecar of claim 2 wherein the chimney is located at a top of the computer chassis cooling side car.

4. The computer chassis cooling sidecar of claim 1 wherein the chassis delivery chamber also has an opening at a bottom end for receiving air from beneath the data center in front or back of the computer chassis.

5. The computer chassis cooling sidecar of claim 1 wherein the air intake chamber and the chassis delivery chamber are connected to make an L-shaped chamber.

6. The computer chassis cooling sidecar of claim 1 wherein the computer chassis cooling sidecar is attached to the exterior of a computer chassis.

7. The computer chassis cooling sidecar of claim 1 wherein the computer chassis cooling sidecar is integrated within the interior of a computer chassis.

8. The computer chassis cooling sidecar of claim 1 wherein the chassis of computers further comprises a blade environment.

9. A system for cooling one or more computers in a chassis of computers in a data center, the system comprising:
   a computer chassis cooling sidecar comprising an air intake chamber and a chassis delivery chamber, the air intake chamber having a first opening for receiving cooled air from source of cooled air,
   the air intake chamber having at the top end a directional vane shaped to direct airflow from the side of the chassis to a chassis delivery chamber; and wherein the chassis delivery chamber resides in front or back of the chassis and has an opening to receive air from the air intake chamber and an opening to deliver the received air to the front or back of the computer chassis; and
   a source of cooled air providing cooled air to the air intake chamber.

10. The system of claim 9 wherein the source of cooled air comprises an air conditioning unit below the floor of a data center.

11. The system of claim 9 wherein the directional vane is insulated and the computer chassis cooling sidecar includes an air outtake chamber thermally separated from the air intake chamber by the insulated directional vane and wherein a side of the directional vane exposed to the air outtake chamber is shaped to direct airflow from the air outtake chamber to a chimney.

12. The system of claim 11 wherein the chimney is located at a top of the computer chassis cooling side car.

13. The system of claim 9 wherein the chassis delivery chamber also has an opening at a bottom end for receiving air from beneath the data center in front or back of the computer chassis.

14. The system of claim 9 wherein the air intake chamber and the chassis delivery chamber are connected to make an L-shaped chamber.

15. The system of claim 9 wherein the computer chassis cooling sidecar is attached to the exterior of a computer chassis.

16. The system of claim 9 wherein the computer chassis cooling sidecar is integrated within the interior of a computer chassis.

17. The system of claim 9 wherein the chassis of computers further comprises a blade environment.

18. A method of cooling one or more computers in a chassis of computers in a data center, the method comprising:
   receiving, by a sidecar positioned exterior to the computer chassis through perforated tiles in the floor of the data center located on the side of the computer chassis, cooled air; and
   directing, by the sidecar, the cooled air from the side of the computer chassis to the front or back of the computer chassis.

19. The method of claim 18 further comprising:
    directing air from the back of the computer chassis to the side of the computer chassis;
    directing air from the side of the computer chassis above the computer chassis.

* * * * *